US010949004B2

(12) United States Patent
Weber et al.

(10) Patent No.: US 10,949,004 B2
(45) Date of Patent: *Mar. 16, 2021

(54) LIGHTING LAMINATED GLAZING WITH A CAPACITIVE TOUCH SENSITIVE DEVICE AND A LIGHT EMITTING DIODE AND THE MANUFACTURING

(71) Applicant: SAINT-GOBAIN GLASS FRANCE, Courbevoie (FR)

(72) Inventors: Patrick Weber, Alsdorf (DE); Stefan Droste, Herzogenrath (DE); Pascal Bauerle, Roye (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/311,931

(22) PCT Filed: Jun. 29, 2017

(86) PCT No.: PCT/IB2017/000971
§ 371 (c)(1),
(2) Date: Dec. 20, 2018

(87) PCT Pub. No.: WO2018/002723
PCT Pub. Date: Jan. 4, 2018

(65) Prior Publication Data
US 2019/0179458 A1    Jun. 13, 2019

(30) Foreign Application Priority Data

Jun. 29, 2016 (EP) .................................. 16305794

(51) Int. Cl.
*G06F 3/041* (2006.01)
*H03K 17/96* (2006.01)
(Continued)

(52) U.S. Cl.
CPC .......... *G06F 3/041* (2013.01); *B32B 17/1022* (2013.01); *B32B 17/10036* (2013.01);
(Continued)

(58) Field of Classification Search
CPC ........ B32B 17/10036; B32B 17/10045; B32B 17/10055; B32B 17/10064;
(Continued)

(56) References Cited

U.S. PATENT DOCUMENTS

| 6,452,514 B1 | 9/2002 | Philipp |
| 9,925,915 B2* | 3/2018 | Bauerle .................. B60K 35/00 |

(Continued)

FOREIGN PATENT DOCUMENTS

| CN | 101687392 A | 3/2010 |
| CN | 104080753 A | 10/2014 |

(Continued)

OTHER PUBLICATIONS

International Search Report as issued in International Patent Application No. PCT/IB2017/000971, dated Nov. 29, 2017.
(Continued)

*Primary Examiner* — Alexander Eisen
*Assistant Examiner* — Nelson Lam
(74) *Attorney, Agent, or Firm* — Pillsbury Winthrop Shaw Pittman LLP

(57) ABSTRACT

A lighting laminated glazing includes a first transparent glazing and a second glazing; an intermediate thermoplastic material layer; an electrically conductive layer between the first and second glazings; a capacitive touch sensitive device including a touch sensitive structure formed in the electrically conductive coating, having a ground electrode and a touch electrode having a touch sensitive area; a light emitting diode on the electrically conductive layer to indicate the touch sensitive area, the diode having a light emitting
(Continued)

surface facing the touch sensitive area, and having a first and a second terminal electrically connected to, respectively, the ground electrode and the touch sensitive area; and a lighting device controlled by the touch sensitive device, the lighting device including a lighting element distinct from the diode, the lighting element being disposed between the first and the second glazing.

22 Claims, 2 Drawing Sheets

(51) Int. Cl.
  *B32B 17/10*     (2006.01)
  *B60Q 3/82*     (2017.01)
  *B60Q 3/208*     (2017.01)

(52) U.S. Cl.
  CPC .. *B32B 17/10211* (2013.01); *B32B 17/10532* (2013.01); *B32B 17/10541* (2013.01); *B32B 17/10761* (2013.01); *B32B 17/10788* (2013.01); *B60Q 3/208* (2017.02); *B60Q 3/82* (2017.02); *H03K 17/962* (2013.01); *H03K 2217/960755* (2013.01); *H03K 2217/960785* (2013.01)

(58) Field of Classification Search
  CPC ........ B32B 17/10073; B32B 17/10165; B32B 17/10174; B32B 17/10192; B32B 17/10211; B32B 17/1022; B32B 17/10532; B32B 17/10541; B32B 17/1055; B60Q 3/12; B60Q 3/14; B60Q 3/208; B60Q 3/217; B60Q 3/82; B60Q 3/85; G06F 3/041; G06F 3/0412; G06F 3/044
  USPC .................................................. 345/173–179
  See application file for complete search history.

(56) References Cited

U.S. PATENT DOCUMENTS

| | | | | |
|---|---|---|---|---|
| 10,523,201 B2* | 12/2019 | Weber | ............... | B32B 17/10293 |
| 10,618,465 B2* | 4/2020 | Laluet | ............... | B32B 17/10788 |
| 10,639,869 B2* | 5/2020 | Bauerle | ................... | H01L 33/54 |
| 10,688,924 B2* | 6/2020 | Bauerle | ............. | B32B 17/10174 |
| 10,743,375 B2* | 8/2020 | Klein | ....................... | H05B 3/86 |
| 10,775,948 B2* | 9/2020 | Weber | ..................... | G06F 3/041 |
| 2006/0275599 A1* | 12/2006 | Lefevre | ............. | B32B 17/10018 |
| | | | | 428/332 |
| 2014/0233240 A1* | 8/2014 | Reul | ................. | B32B 17/10541 |
| | | | | 362/295 |
| 2014/0377580 A1 | 12/2014 | Manz | | |
| 2015/0165965 A1* | 6/2015 | Masaki | ............. | B32B 17/10761 |
| | | | | 362/513 |
| 2015/0303912 A1* | 10/2015 | Coutts | ..................... | H03K 17/16 |
| | | | | 307/29 |
| 2016/0086456 A1* | 3/2016 | Wittenberg | ............... | G08B 5/36 |
| | | | | 455/566 |
| 2016/0315236 A1* | 10/2016 | Makkonen | ............. | H05K 1/092 |
| 2016/0325529 A1* | 11/2016 | Linthout | ........... | B32B 17/10036 |
| 2018/0175857 A1* | 6/2018 | Weber | ............... | B32B 17/10036 |
| 2019/0001629 A1* | 1/2019 | Laluet | ............... | B32B 17/10036 |
| 2019/0134954 A1* | 5/2019 | Bauerle | ................... | B60K 37/06 |
| 2019/0179459 A1* | 6/2019 | Weber | ............... | B32B 17/10467 |
| 2019/0193376 A1* | 6/2019 | Bauerle | ................ | B60Q 1/2696 |
| 2019/0299852 A1* | 10/2019 | Bauerle | ................. | B60Q 3/208 |
| 2020/0298534 A1* | 9/2020 | Berard | ..................... | B60Q 3/76 |
| 2020/0338866 A1* | 10/2020 | Mannheim Astete | ..................... | B32B 17/10981 |

FOREIGN PATENT DOCUMENTS

| | | |
|---|---|---|
| CN | 104379344 A | 2/2015 |
| DE | 20 2006 006 1 | 7/2006 |
| DE | 20 2008 017 6 | 4/2010 |
| EP | 0 899 882 A1 | 3/1999 |
| EP | 0 847 965 B1 | 10/2004 |
| EP | 1 515 211 A1 | 3/2005 |
| WO | WO 2008/113978 A1 | 9/2008 |
| WO | WO 2012/052315 A1 | 4/2012 |
| WO | WO 2013/189796 A1 | 12/2013 |
| WO | WO 2015/086599 A1 | 6/2015 |
| WO | WO 2015/086683 A1 | 6/2015 |
| WO | WO 2015/162107 A1 | 10/2015 |

OTHER PUBLICATIONS

Office Action as issued in Chinese Patent Application No. 201780001653.3, dated May 26, 2020.

* cited by examiner

LIGHTING LAMINATED GLAZING WITH A CAPACITIVE TOUCH SENSITIVE DEVICE AND A LIGHT EMITTING DIODE AND THE MANUFACTURING

CROSS-REFERENCE TO RELATED APPLICATIONS

This application is the U.S. National Stage of PCT/IB2017/000971, filed Jun. 29, 2017, which in turn claims priority to French patent application number 16305794 filed Jun. 29, 2016. The content of these applications are incorporated herein by reference in their entireties.

TECHNICAL FIELD OF THE INVENTION

The invention relates to a lighting laminated glazing including a capacitive touch sensitive device and a light emitting diode, and a method for manufacturing said glazing.

BACKGROUND OF THE INVENTION

Nowadays, glazing which integrates a switch device, in the form of a touch sensitive device, are being developed. The touch sensitive device enables to control a functional element.

The touch sensitive device is formed by an arrangement of two coupled electrodes arranged on the same layer or on different layers. In the case for example of a capacitive touch sensitive device, when it is approached by a human finger, the capacitance between the two coupled electrodes changes. The capacitance change is measured by a circuit arrangement and when a threshold value is exceeded, a switching signal is triggered.

As described in WO2015/162107A1, a light source such as a light emitting diode is indicating the position of the touch sensitive device. However, there are significant drawbacks, such as alignment problems during the manufacturing process of the glazing.

SUMMARY OF THE INVENTION

The present invention aims to solve the problems that have just been described above by proposing an improved integration of a touch sensitive device and a light emitting diode into the glazing.

Thus, a first aspect of the present invention relates to a lighting laminated glazing comprising:
 a first transparent glazing; preferably bent if for vehicle (automotive)
 a second glazing; preferably bent if for vehicle (automotive)
 an intermediate layer laminating the second glazing to the first transparent glazing; made of thermoplastic material preferably polyvinyl butyral (PVB) for automotive glazing or ethylene vinyl acetate (EVA) for building glazing,
 an electrically conductive layer disposed between of the first transparent glazing and the second glazing, preferably transparent (enabling vision) if in a transparent zone of the touch control glazing, or optionally in a (local) peripheral area with a masking layer, like enamel layer, on the first main surface or on the second main surface of first and/or second glazing;
 a capacitive touch sensitive device, notably supplied by alternative source, comprising a touch sensitive structure formed in said electrically conductive layer, the touch sensitive structure comprising a ground electrode and a touch electrode having a touch sensitive area; notably the touch electrode being surrounded by the ground electrode, the touch electrode and the ground electrode being electrically insulated from one another by a dividing line,
 a light emitting diode, called indicator diode, arranged on the electrically conductive layer to indicate the touch sensitive area, the light emitting diode having a light emitting surface facing at least partially the touch sensitive area, the light emitting diode having a first terminal being a first electrode electrically connected to the ground electrode and a second terminal being a second electrode zone electrically connected to the touch sensitive area;
 a lighting device controlled by the capacitive touch sensitive device, the lighting device comprising a lighting element distinct from the indicator diode, the lighting element being disposed between the first transparent glazing and the second glazing.

In the context of the invention, the term transparent means that the transmittance of light comprised in the visible spectral range is preferably greater or equal to 70% and even to 80% or to 90%. However, when the visibility through the glazing is not recommended, the light transmittance may be much lower, for example, greater than 1% or than 5%.

The light emitting (indicator) diode and the touch sensitive structure are arranged in such a way that thus there is no need to align an additional layer with the electrically conductive layer, which simplifies the manufacturing process. Besides, the thickness of the lighting laminated glazing can be reduced. There is no other layer arranged between the touch sensitive structure and the light emitting (indicator) diode. Moreover, in this configuration, there are fewer components, such as connectors or wires, than previously. This results, combined with the simplification of the manufacturing process, in a reduction in the manufacturing cost.

The first transparent glazing preferably contains prestressed, partially prestressed, or non-prestressed glass, particularly preferably float glass, quartz glass, borosilicate glass, soda lime glass, or clear plastics, in particular polyethylene, polypropylene, polycarbonate, polymethyl methacrylate, polystyrene, polyimide, polyester, polyvinyl chloride, and/or mixtures thereof.

The thickness of the first transparent glazing may vary widely and thus be ideally adapted to the requirements of the individual case. The first transparent glazing preferably has a thickness lower to 10 mm and even to 8 mm and particularly preferably lower to 5 mm and very particular lower than 3 mm for automotive applications (notably land road vehicle) and even lower than 1.1 mm. This first transparent glazing can be tempered notably chemically tempered if the thickness is lower than 1.1 mm. This first transparent glazing could be the inner glazing of a laminated glazing preferably with a second transparent glazing having thicker thickness. The area of the first transparent glazing may vary widely, for example, from 100 cm$^2$ to 18 m$^2$. Preferably, the first transparent glazing has an area from 400 cm$^2$ to 4 m$^2$, as is common for motor vehicle glazings and for structural and architectural glazings.

In a preferred embodiment, the touch control glazing being a laminated glazing is configured to form a vehicle windshield or roof or side window, or a door or window or even a partition for a building.

In case of building, the laminated glazing could be also a part of a multiple insulating glazing usually double glazing unit or triple glazing unit. It is preferred that the first transparent glazing is the most inner glazing.

The vehicle can be an individual road land vehicle (car) or a transportation vehicle by water (boat), land (truck, bus, tramway, rail vehicle), or air (aircraft).

The invention is preferred for a (land, road) vehicle windshield or roof or even a side window (or a door or window or a partition for a building).

The intermediate layer preferably contains at least one thermoplastic plastic, preferably polyvinyl butyral (PVB), ethylene vinyl acetate (EVA), and/or polyethylene terephthalate (PET). However, the thermoplastic intermediate layer may also contain, for example, polyurethane (PU), polypropylene (PP), polyacrylate, polyethylene (PE), polycarbonate (PC), polymethyl methacrylate, polyvinyl chloride, polyacetate resin, casting resins, acrylates, fluorinated ethylene propylene, polyvinyl fluoride, and/or ethylene tetrafluoroethylene, or copolymers or mixtures thereof. The thermoplastic intermediate layer may be formed by one or even by a plurality of thermoplastic films arranged one above the other, with the thickness of one thermoplastic film preferably not more than 1 mm notably from 0.25 mm or 0.5 mm to 1 mm or 0.9 mm, typically around 0.4 mm or 0.7 mm.

For land vehicle, it is preferably polyvinyl butyral (PVB). For roof or side window or windshield, it could be acoustical PVB, tinted or not. For windshield, it could be wedge PVB, and/or tinted or not, and/or acoustical or not.

The second glazing preferably contains prestressed, partially prestressed, or non-prestressed glass, particularly preferably float glass, quartz glass, borosilicate glass, soda lime glass, or clear plastics, in particular polyethylene, polypropylene, polycarbonate, polymethyl methacrylate, polystyrene, polyimide, polyester, polyvinyl chloride, and/or mixtures thereof. The second transparent glazing preferably has a thickness lower to 10 mm and even to 8 mm and particularly preferably lower to 5 mm and very particular lower than 3 mm for automotive applications (notably car). This second transparent glazing can be tempered. As for the first transparent glazing, the area of the second transparent glazing may vary widely, for example, from 100 $cm^2$ to 18 $m^2$. Preferably, the second transparent glazing has an area from 400 $cm^2$ to 4 $m^2$, as is common for motor vehicle glazings and for structural and architectural glazings. We prefer choosing first and second glazing having the same size.

The touch control element can comprise another functional element controlled by the capacitive touch sensitive device or the laminating glazing can comprise another one capacitive touch control element, said another functional element being chosen among one or several of the following: heating element, a suspended particle device, a liquid crystal device, an electrochromic device, and also for windshield: a display device, wipers or air conditioning of a vehicle, or for side window a locking system.

In an embodiment of a lighting laminated glazing according to the invention, the touch electrode is surrounded by the ground electrode, the touch electrode and the ground electrode being electrically insulated from one another by a dividing line. The light emitting (indicator) diode is preferably arranged over the dividing line.

In a preferred embodiment, the dividing line is patterned so that the ground electrode comprises a ground path protruding into the touch sensitive area, the ground path being delineated by a first part of the dividing line. Preferably, the light emitting (indicator) diode is arranged over the first part of the dividing line, the first terminal of the light emitting (indicator) diode being electrically connected to the ground path.

The touch area has a given width. Preferably, the ground path has a length less than or equal to the width of the touch area.

Preferably, the touch area has a shape symmetrical with respect to a centre point, the light emitting diode (indicator diode) being preferably arranged (substantially) over the centre point.

In a preferred embodiment, the lighting laminated glazing is configured to form a vehicle roof, notably automotive roof, the first glazing and the second glazing each having a first main surface and a second main surface opposed to the first main surface. Preferably, the second main surface of the first transparent glazing is intended to be oriented toward the inside of the vehicle, and the first main surface of the second glazing is intended to be oriented toward the outside of the vehicle. In this case, the first main surface of the first transparent glazing and the second main surface of the second transparent glazing are inner-side surfaces of the lighting laminated glazing. In this embodiment, the first transparent glazing is the interior glazing and the second glazing is the exterior glazing.

Preferably, the electrically conductive layer is disposed closest to the first main surface of the first transparent glazing.

In a more preferred embodiment of a lighting laminated glazing as an automotive glazing roof, the lighting device (set of LED or even at least one OLED) is configured to illuminate the inside of the vehicle lighting, notably a reading function.

In yet a more preferred embodiment, the touch sensitive structure is preferably formed in a first portion of the electrically conductive layer, the lighting device comprising:
  an electrically conductive structure preferably formed in a second portion of the electrically conductive layer, the second portion being electrically insulated from the first portion, the electrically conductive structure comprising a negative electrode and a positive electrode;
  a plurality of (preferably high-output) light emitting diodes (notably more powerful than the indicator diode), preferably inorganic-, arranged on the electrically conductive structure, each (high-output) light emitting diode having a first terminal being an anode zone electrically connected to the negative electrode, and a second terminal being a cathode zone electrically connected to the positive electrode, the (high-output) light emitting diodes forming the lightning element of the lighting device.

Such an arrangement is particularly simple and economical to produce, the same electrically conductive layer being used to connect the indicator diode and the (high-output) light emitting diodes.

Preferably, the positive electrode is surrounded by the negative electrode, the positive electrode and the negative electrode being electrically insulated from one another by a dividing line, each (high-output, inorganic) light emitting diode being arranged over the dividing line.

Preferably, the touch electrode is surrounded by the ground electrode, the ground electrode is surrounded by the positive electrode and the positive electrode is surrounded by the negative electrode. In this case, the plurality of (high-output, inorganic) light emitting diodes is preferably arranged in a circle or square or any closed (polygonal) surface (substantially) centred at the light emitting (indicator) diode. It could also form a cross including the indicator diode (on the center).

In an embodiment, the (high-output, inorganic) light emitting diodes are disposed around the indicator diode. In another embodiment, the orthogonal projections of the (high-output, inorganic) light emitting diodes on the conductive layer are situated around the indicator diode.

The width of the dividing lines is preferably from 30 µm to 200 µm and particularly preferably from 70 µm to 140 µm. Such thin dividing lines permit a safe and adequately high, electrical insulation and, at the same time, disrupt vision through the lighting laminated glazing only slightly or not at all. The production of the dividing lines is preferably done by laser patterning or chemical or mechanical removal.

The electrically conductive layer preferably contains a transparent electrically conductive layer. Electrically conductive layers according to the invention are known, for example, from DE 20 2008 017 611 U1, EP 0 847 965 B1, or WO2012/052315 A1. They typically contains one or a plurality, for example, two, three, or four electrically conductive, functional layers. The functional layers preferably contain at least one metal, for example, silver, gold, copper, nickel and/or chromium, or a metal alloy. The functional layers particularly preferably contain at least 90 wt. % of the metal, in particular at least 99.9 wt.-% of the metal. The functional layers may be made of the metal for the metal alloy. The functional layers particularly preferably contain silver or a silver-containing alloy. Such functional layers have particularly advantageously electrical conductivity and, at the same time, high transmittance in the visible spectral range. The thickness of a functional layer is preferably from 5 nm to 50 nm, particularly preferably from 8 nm to 25 nm. In this range for the thickness of the functional layer, advantageously high transmittance in the visible spectral range and particularly advantageous electrical conductivity are obtained.

Typically, at least one dielectric layer is arranged in each case between two adjacent functional layers of the electrically conductive layer. Preferably, another dielectric layer is arranged below the first and/or above the last functional layer. A dielectric layer contains at least one individual layer made of a dielectric material, for example, containing a nitride such as silicon nitride or an oxide such as aluminium oxide. Dielectric layers may, however, also contain a plurality of individual layers, for example, individual layers of a dielectric material, smoothing layers, matching layers, blocker layers, and/or antireflection layers. The thickness of a dielectric layer is, for example, from 10 nm to 200 nm.

This layer structure is generally obtained by a sequence of deposition operations that are performed by a vacuum method such as magnetic field-supported cathode sputtering.

Other suitable electrically conductive layers are transparent conductive oxide (known as TCO) notably indium tin oxide (ITO) layer, fluorinated tin oxide ($SnO_2$:F) layer, or gallium and or/aluminium-doped zinc oxide (ZnO:Al; ZnO:Ga) . . . .

The electrically conductive layer may, in principle, be any coating that can be contacted electrically. If the lighting laminated glazing according to the invention is intended to enable vision through it, such as is the case, for example, for glazing in the window area, the electrically conductive layer is preferably transparent. In an advantageous embodiment, the electrically conductive layer is a layer or a layer structure of a plurality of individual layers with a total thickness less than or equal to 2 µm, particularly preferably less than or equal to 1 µm even less than 300 nm or 100 nm.

The electrically conductive layer preferably has a sheet resistance from 0.4 ohm/square to 200 ohm/square. Indeed, the touch sensitive structure of the touch sensitive device has to transport only low currents, thus the sheet resistance of the layer may be selected in a wide range of values. An advantageous electrically conductive layer according to the invention has a sheet resistance from 0.4 ohm/square to 10 ohm/square. In a particularly preferred embodiment, the electrically conductive layer according to the invention has a sheet resistance from 0.5 ohm/square to 1 ohm/square. Coatings with such sheet resistances are particularly suited for heating the glazing with typical on-board voltages from 12 V to 48 V or, in the case of electric vehicles, with typical on-board voltages of as much as 500 V. The electrically conductive layer may be transparent and extend over (substantially) the entire surface of the first transparent glazing (sometimes except any removal at peripheral edge(s) for example, notably behind masking layer on S4 or S3 or between masking layer(s) on S2 and also S3 or S4), with some local removal(s) possible (insolating line(s) preferably invisible or nearly invisible, for letting electromagnetic waves going through etc).

However, alternatively, the electrically conductive layer may extend over only a part of the surface of the first transparent glazing (being local) and even wherein this is a masking layer (enamel) or S4 (or S3) and even on S2. In this case the electrically conductive layer is for example opaque, can be metallic like copper. Moreover it could be in a local carrier which is not for example a transparent carrier, notably any printed circuit card (PCB).

The electrically conductive layer may be transparent and extend over (substantially) the entire surface of the first transparent glazing or being local. The electrically conductive layer is thus preferably being chosen among a heating element, a solar control layer, a low E layer, the electrically conductive layer in contact with the first main surface of the first transparent glazing or not in contact (separated by thermoplastic layer like PVB for example).

In the laminated glazing for vehicle (for touch control from inner side of vehicle), It is preferred that electrically conductive layer is closest to first transparent glazing that to second transparent glazing (exterior glazing). We can choose the thickness of PVB and exterior glazing to this purpose. More broadly switching from outside could be not possible due to sensitivity adaption and/or PVB and thicker outer (external) glazing in direction away from the user.

The electrically conductive layer may extend over the entire surface of the first transparent glazing. However, alternatively, the electrically conductive layer may extend over only a part of the surface of the first transparent glazing. The electrically conductive layer preferably extends over at least 50%, particularly preferably over at least 70%, and most particularly preferably over at least 90% of the surface of the first transparent glazing. The electrically conductive layer may have one or a plurality of uncoated zones. These zones may be transparent to electromagnetic radiation and are known, for example, as a data transmission windows or communication windows.

Advantageously, the ground electrode and the touch electrode form a capacitor having a capacitance which changes with the proximity or the contact of an object that triggers the touch sensitive device, preferably a human finger or an object whose permittivity is close to that of the human finger. Of course, the touching can be done with one or even multiple fingers or a different part of the human body. In the context of this invention, "touching" means any interaction with the touch sensitive area that results in a measurable change in the measurement signal, i.e., in this case, the capacitance.

The capacitance can be measured via external capacitance sensor electronics.

The capacitance change is for example measured by a circuit arrangement or sensor electronics and when a threshold value is exceeded, a switching signal is triggered. Circuit arrangements for capacitive switches are known, for example, from DE 20 2006 006 192 U1, EP 0 899 882 A1, U.S. Pat. No. 6,452,514 B1, and EP 1 515 211 A1. The sensor electronics are preferably capacitive sensor electronics.

The switching signal issued can be of any type and adapted to the requirements of the respective use. Thus, the switching signal can mean a positive voltage, for example, 12 V, no switching signal can mean, for example, 0 V, and another switching signal can mean, for example, +6 V. The switching signal can also correspond to the voltages CAN_High and CAN_Low customary with a CAN-Bus and change by a voltage value between them. The switching signal can also be pulsed and/or digitally coded.

The sensitivity of the sensor electronics can be determined as a function of the size of the touch sensitive area and as a function of the thickness of the first transparent glazing, intermediate layer(s), and a second transparent glazing in the context of simple experiments.

The indicator diode (eg an inorganic diode) can produce a continuous or even a flashing light. In an advantageous embodiment of a lighting laminated glazing according to the invention, the capacitive touch sensitive device comprises a sensor electronics assembly configured to control the touch sensitive structure, and a voltage source configured to supply power voltage (preferably DC voltage source) to the light emitting (indicator) diode through the touch sensitive structure. The sensor electronics assembly and/or the voltage source are preferably disposed outside the lighting laminated glazing, more preferably in a peripheral zone of the lighting laminated glazing. The sensor electronics assembly can be implemented such that upon a touch of the touch area by a person, a switch signal is generated.

Advantageously, the capacitive touch sensitive device comprises a first linear, electrically conductive element connecting the sensor electronics assembly and the voltage source to the ground electrode, and a second linear, electrically conductive element connecting the sensor electronics assembly and the voltage source to the touch electrode on one side.

The linear, electrically conductive elements are preferably electrically conductive wires. If needed, the wires are advantageously implemented very thin such that they do not or only slightly impair vision through the lighting laminated glazing. Preferred wires have a thickness less than or equal to 0.25 mm, particularly preferably from 0.02 mm to 0.15 mm. The wires are preferably metallic, contain in particular copper, tungsten, gold, silver, or aluminium or alloys of at least two of these metals or are made therefrom. The alloys may also contain molybdenum, rhenium, osmium, iridium, palladium, or platinum.

The wires are preferably electrically insulated, for example, by sheathing electrical insulation made of plastic. This is particularly advantageous if the wires run on the electrically conductive layer or other electrically conductive elements of the lighting laminated glazing.

In another advantageous embodiment, the capacitive touch sensitive device comprises means for controlling the operation of the light emitting diode and the voltage source, preferably DC voltage source. Advantageously, the means for controlling the operation of the light emitting (indicator) diode and the voltage source are connected in series with the light emitting diode.

Moreover, the voltage source, preferably DC voltage source, can be decoupled from the sensor electronics assembly. Preferably the DC voltage source is decoupled by a capacitor from the sensor electronics assembly for example feeding to the touch sensitive structure an alternative switch signal notably at a frequency preferably of at least 60 Hz and more preferably up to 100 Hz.

The touch sensitive structure preferably has an area from 1 $cm^2$ to 200 $cm^2$, particularly preferably from 1 $cm^2$ to 10 $cm^2$. The touch area may, for example, have the shape of an oval, an ellipse or a circle, a triangle, a rectangle, a square, or another type of quadrilateral or a higher polygon.

The lighting laminated glazing according to the invention includes a light emitting diode with which the touch sensitive area is indicated. This is particularly advantageous, especially in the case of transparent, non-visible, or hardly visible touch sensitive area, as this makes it possible to touch the touch sensitive area with certainty and to trigger the switch operation with certainty but without having additional periphery harming the transparency as the light emitting diode is placed on the same electrically conductive layer. The light emitting diode is advantageous, in particular at night or in the dark, as this makes it possible to find the touch sensitive area quickly. In particular, when using the invention as a vehicle glazing, it is very easy for the driver to find and touch the touch sensitive area without being distracted too long from the traffic situation. The light emitting diode is also able to show the status of the switched function by its intensity (e.g. on/off of the lighting device).

The terminals of the light emitting (indicator) diode may be in direct contact with their respective electrodes. In this case, the light emitting (indicator) diode may be glued to the electrically conductive layer or held in place by an adhesive layer or by any other suitable means. Alternatively, the terminals may be electrically connected to their respective electrodes by means of solder connections, conductive adhesive or conductive paste. The terminals may also be electrically connected to their respective electrodes by wire bonding.

In an advantageous embodiment of an lighting laminated glazing according to the invention, the light emitting (indicator) diode is a multicolour inorganic light emitting diode comprising a plurality of light emitting semiconductor chips, for example red, green and blue. Each light emitting semiconductor chip has a first terminal and a second terminal. Preferably, the touch sensitive structure comprises a plurality of ground paths electrically insulated from one another by dividing lines. Thus, each second terminal is electrically connected to one of the ground paths. The touch sensitive device is intended to control a functional element. Thus, the different colours of the light emitting diode enable for example to indicate different states of the functional element.

The inorganic light emitting diode (indicator light and even each light emitting diode forming the lighting device) may be a packaged light emitting diode or a chip-on-board light emitting diode. Eventually, the light emitting diode may be a reverse mounted light emitting diode, which means that the first and second terminals as well as the light emitting surface are disposed on the same side of the light emitting diode. The inorganic diodes are for example based on gallium phosphide or aluminum gallium and gallium nitride.

The width (or length) of a diode with a single semiconductor chip, generally a diode of square shape, is preferably at most 5 mm. The length of a diode with a plurality of semiconductor chips (typically encircled by the package), generally of rectangular shape, is preferably at most 20 mm and better still at most 10 mm In an embodiment, the light emitting diode comprises and even is an organic light emitting diode (OLED) and even the lighting device is OLED.

Preferably the height of the organic or inorganic light emitting diode diode is at most 1 mm and even at most 0.8 mm.

The electrically conductive layer may be applied on a carrier (film) bonded to the first transparent glazing.

The carrier could be local or could be preferably both transparent and extends over the surface of the first transparent glazing. The electrically conductive layer is also transparent and extends over the surface of the first transparent glazing (and the carrier), and preferably being chosen among a heating element, a solar control layer, a low e layer, the electrically conductive layer being in contact or not with the first main surface S3 of the first transparent glazing.

The carrier—preferably transparent—is preferably a plastic foil—notably a PET—

It has preferably having a thickness lower than 0.2 mm and even than 0.1 mm in between S2 and S3 of the laminated glazing. Said plastic foil is preferably bonded to the first transparent glazing by a thermoplastic sheet like PVB or by adhesive and/or bonded to the second transparent glazing by a thermoplastic sheet like PVB or by adhesive. A preferred case is that it is bonded to the second transparent glazing by a thermoplastic sheet like PVB (electrically conductive layer oriented to S3) and even preferably bonded to the first transparent glazing by a thermoplastic sheet like PVB.

The carrier film preferably contains at least one polyester and/or one polyimide, particularly preferably a thermoplastic polyester, for example, polyethylene naphthalate (PEN) or polyethylene terephthalate (PET). This is particularly advantageous with regard to the stability and workability of the carrier film. The carrier film may be bonded to the first transparent glazing by adhesive means or via an intermediate layer, preferably similar to the intermediate layer bonding the second glazing to the first transparent glazing. The thickness of the carrier film is preferably from 10 μm to 1 mm, particularly preferably from 30 μm to 200 μm. In this range of thickness, the carrier film is advantageously stable and readily workable. The length and width of the carrier film can be equal to the length and width of the first transparent glazing. The length and width of the carrier film can also be smaller than the length and width of the first transparent glazing (e.g. PET inlet).

The carrier (which is preferably flexible enough to follow the curvature of a curved laminated glazing unit) may be adhesively bonded or pressed against S2 for the windshield or roof or S3 for a side window (for light outside) or S2 for a side window (for light inside).

In one embodiment, the carrier may even be placed in a region of the front windshield or roof, region in which the exterior glazing is rendered entirely (or partially) opaque by the (outermost) opaque layer, such as a (black) enamel, preferably on S2.

The carrier may be placed in a region, which the interior glazing is rendered opaque by an opaque layer (the innermost) such as a (black) enamel preferably on S4 or even on S3. This opaque layer then includes aperture (by masking on deposition or by removal especially with a laser) at least in line with the light emitting diode.

By way of flexible carrier mention may be made of the range of products AKAFLEX® (especially PCL FW) from KREMPEL.

The thinnest possible and even preferably the discreetest possible flexible carrier (minimum width or even transparent), for example including PET, PEN or a polyimide, will be chosen, and, transparent connection tracks may even be chosen (rather than tracks made of copper unless they are made sufficiently thin).

For adhesive bonding to S2 or S3 (of local carrier notably) it is preferably transparent double-sided adhesive of thickness of at most 0.15 mm and better still 0.1 mm and in particular lower than 0.05 mm, the entire surface or a part of the carrier being adhesively bonded In an alternative embodiment, the lighting laminated glazing comprises a plurality of touch sensitive structures, each one controlling a functional element.

A second aspect of the present invention relates to a method for manufacturing a lighting laminated glazing according to the first aspect of the invention, the lighting laminated glazing comprising:
  a first transparent glazing;
  a second glazing;
  an intermediate layer bonding the first transparent glazing to the second glazing;
  a capacitive touch sensitive device comprising a touch sensitive structure;
  a lighting device controlled by the touch sensitive device, the lighting device comprising a lighting element;
the method comprises the following steps:
  disposing an electrically conductive layer between the first transparent glazing and the second glazing;
  forming the touch sensitive structure in the electrically conductive layer, the touch sensitive structure comprising a ground electrode and a touch electrode having a touch sensitive area;
  arranging a light emitting diode on the electrically conductive layer to indicate the touch sensitive area, the light emitting diode having a light emitting surface facing at least partially the touch sensitive area, the light emitting diode having a first terminal being an first electrode zone electrically connected to the ground electrode and a second terminal being a second electrode zone electrically connected to the touch sensitive area;
  disposing the lighting element between the first transparent glazing and the second glazing.

In a preferred embodiment, the step of disposing the electrically conductive layer between the first transparent glazing and the second glazing comprises the steps of applying the electrically conductive layer on a carrier layer, and disposing the carrier layer between the first transparent glazing and the second glazing.

Alternatively, the step of disposing the electrically conductive layer between the first transparent glazing and the second glazing may comprise the step of applying directly the electrically conductive layer on an inner-side surface of the lighting laminated glazing, preferably on the first transparent glazing.

The application of the electrically conductive layer may be done by methods known per se, preferably by magnetic field-supported cathode sputtering. This is particularly advantageous with regard to simple, quick, economical, and uniform coating of the first transparent glazing. However, the electrically conductive layer may also be applied, for example, by physical vapor deposition (PVD), chemical vapor deposition (CVD), plasma-enhanced chemical vapor deposition (PECVD), or by wet chemical methods.

After the application of the electrically conductive layer, the first transparent glazing may be subjected to a temperature treatment. The first transparent glazing with the electrically conductive layer is heated to a temperature of at least 200° C., preferably at least 300° C. The temperature treatment may serve to increase the transmittance and/or to reduce the sheet resistance of the electrically conductive layer.

After the application of the electrically conductive layer, the first transparent glazing may be bent, typically at a temperature from 500° C. to 700° C. Since it is technically simpler to coat a flat glazing, this procedure is advantageous if the first transparent glazing is to be bent. Alternatively, however, the first transparent glazing may also be bent before the application of the electrically conductive layer, for example, if the electrically conductive layer is not suited to withstand a bending process without damage.

BRIEF DESCRIPTION OF THE DRAWINGS

The invention will be further explained below by means of exemplary embodiments with reference to the attached figures, in which.

The figures are only presented for indicative purposes and in no way limit the invention.

In the figures the same reference numbers denote the same or analogue components.

DETAILED DESCRIPTION

Figure 1A:
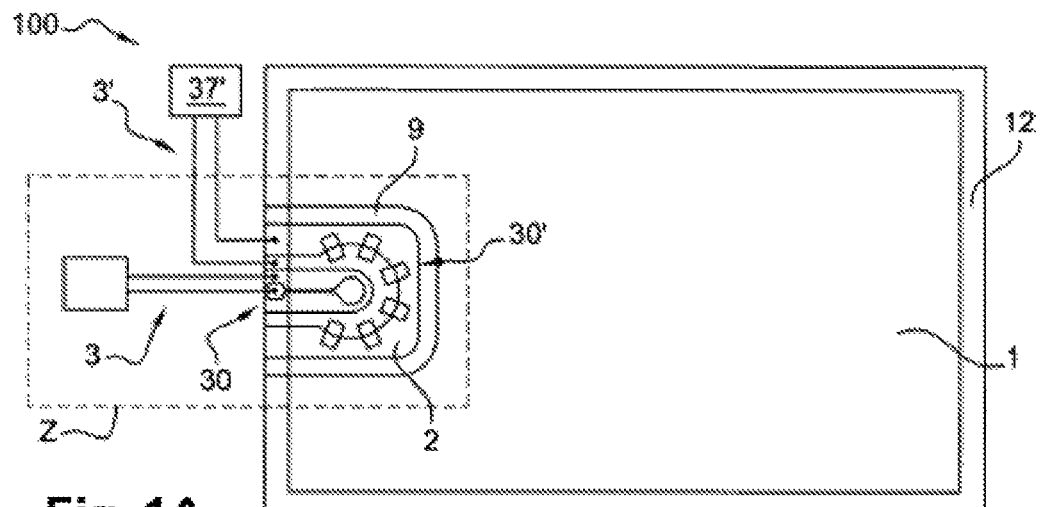
FIG. 1A is a top view of an embodiment of a lighting laminated glazing according to the first aspect of the invention.

FIG. 1A shows an exemplary embodiment of a lighting laminated glazing 100 in the form of an automotive glazing roof. The lighting laminated glazing 100 comprises a first transparent glazing 1 made, for example, of mineral glass, an electrically conductive layer 2, and a touch sensitive device 3 which includes a touch sensitive surface 30 formed in the electrically conductive layer 2. The electrically conductive layer 2 is preferably a layer system, which includes, for example, three electrically conductive silver layers that are separated from each other by dielectric layers.

In this embodiment, the electrically conductive layer 2 is applied on a carrier layer 9 which is disposed inside the lighting laminated glazing 100. The carrier layer 9 facilitates the arrangement of the electrically conductive layer 2 inside the lighting laminated glazing 100. The carrier layer 9 may be a printed board card (PCB) or a plastic foil, preferably containing polyethylene terephthalate (PET).

The electrically conductive layer 2 has preferably a common edge with the lighting laminated glazing 100. This facilitates the implementation of connections with the outside of the lighting laminated glazing 100.

The lighting laminated glazing 100 also comprises a capacitive touch sensitive device 3 which includes a touch sensitive surface 30 formed in the electrically conductive layer 2. Now referring to FIG. 1B in addition to FIG. 1A, the touch sensitive structure 30 comprises a ground electrode 31 and a touch electrode 32 having a touch area 32a. The ground electrode 31 and the touch electrode 32 are both parts of the electrically conductive layer 2. The capacitive touch sensitive device 3 is a switch device able to be triggered by the presence of an object, preferably a human finger, contacting or proximal to the touch sensitive area 32a.

The ground electrode 31 and the touch electrode 32 form a capacitor having a capacitance which changes when the object that triggers the touch sensitive device 3 come close to or comes into contact with the touch area 32a. The capacitive touch sensitive device 3 comprises a capacitive sensor electronics assembly 33 which measures the capacitance change. When the measured capacitance change is higher than a threshold value set by the sensor electronics assembly 33, a switching signal is triggered. The switching signal enables to control a lighting device associated with the capacitive touch sensitive device.

The sensor electronics assembly 33, which controls the touch sensitive structure 30, is connected to the ground electrode 31 via a first electrically conductive element 41 and to the touch electrode 32 via a second electrically conductive element 42. The electrically conductive elements 41, 42 may be foil conductors made for example of copper. They are preferably electrically insulated, especially from the electrically conductive layer 2, by sheathing electrical insulation made for example of polyimide.

The touch electrode 32 is preferably surrounded by the ground electrode 31. These two electrodes are electrically insulated from one another preferably by a first dividing line 35, which is a line along which the electrically conductive layer 2 is removed so that there is no electrical conduction from one side of the line to the other side. The first dividing line 35 has a width d1 (shown in FIG. 1C) of, for example, 100 µm and is, for example, introduced into the electrically conductive layer 2 by laser patterning.

In this embodiment, the touch electrode 32 comprises three different zones: the touch area 32a situated at an extremity of the touch electrode 32, a connection area 32b situated at another extremity of the touch electrode 32 and to which the sensor electronics assembly 35 is connected via the second electrically conductive element, and a supply line zone 32c which electrically conductively connects the touch area 32a to the connection area 32b. The touch area 32a is substantially drop-shaped and transitions into the supply line zone 32c. The term "drop-shaped" means that the touch area 32a is substantially circular and tapers funnel-like on one side toward the supply line zone 32c. The touch area 32a has a width W1 of, for example, 40 mm. The supply line zone 32c has for example a width of 1 mm and a length of 48 mm. The connection area 32b has a square shape with rounded corners and a width of, for example, 12 mm. The square is advantageous to place and contact a foil conductor to the shape.

The supply line zone 32c is not sensitive due to its small dimensions and its small capacitance change when touched, and so it helps to lead to the touch sensitive area 32a to a desired position. Furthermore, the sensor electronics assembly 33 connected to the touch sensitive structure 30 may also be selected in its sensitivity such that only upon touching a zone of the lighting laminated glazing 100 in the region of the touch area 32a, a capacitive field is formed. In contrast, a touching of the lighting laminated glazing 100 above the supply line zone 32c triggers no switching signal.

A light emitting diode 6 is arranged on the electrically conductive layer 2 to indicate the touch sensitive area 32a.

Thus, the light emitting diode is also called an indicator diode. The light emitting diode 6 has a light emitting surface facing at least partially the touch sensitive area 32a. In this context, the term facing refers to an orthogonal projection of the light emitting surface in the plane of the touch sensitive area 32a. Indeed, in this embodiment, the light emitting surface is not facing the touch sensitive area 32a but the opposite direction, as represented by the arrow 7 in FIG. 1C. The light emitting surface is oriented toward the side of the lighting laminated glazing 100 from which the touch sensitive area 32a is intended to be touched.

The light emitting diode 6 is connected in the forward direction. In other words, the light emitting diode 6 has a first terminal 61, or negative side, electrically connected to the ground electrode 31 and a second terminal 62, or positive side, electrically connected to the touch electrode 32. The first terminal 61 is anode zone and the second terminal 62 is a cathode zone.

The terminals 61, 62 may be in direct contact their respective electrodes. In this case, the light may be glued to the electrically conductive layer 2 or held in place by an adhesive layer or by any other suitable means. Alternatively, the terminals 61, 62 may be electrically connected to their respective electrodes 31, 32 by means of solder connections, conductive adhesive or conductive paste. The terminals 61, 62 may also be electrically connected to their respective electrodes 31, 32 by wire bonding.

Advantageously, the touch sensitive device 3 comprises a first voltage source 37 which supplies power voltage to the light emitting diode 6 through the touch sensitive structure 30. The first voltage source 37 has a positive terminal connected to the touch electrode 32 via the second electrically conductive element 42 and a negative terminal connected to the ground electrode 31 via the first electrically conductive element 41. Thus, there is no need for independent electrically conductive connectors for the light emitting diode, which results in manufacturing cost savings as well as in a simplified manufacturing method. By help of separate the touch signals from the supply voltage of the light emitting diode 6, it was surprisingly possible to let the illumination and the touch work having a common circuit.

The first voltage source 37 is preferably decoupled from the sensor electronics assembly 33, for example by a capacitor 39 or by any suitable decoupling means. Thus, the first voltage source 37 and the sensor electronics assembly 33 do not influence each other.

The touch sensitive device 3 preferably comprises means 38 for controlling the operation of the light emitting diode 6 and the first voltage source 37. Thus, the light emitting diode 6 is not necessarily always turned on. For example, thanks to the controlling means 38, the light emitting diode 6 may be turned on during night time, when it is most needed, and turned off during day time. In this embodiment, the controlling means 38 are connected in series with the light emitting diode 6 and the first voltage source 37.

The first dividing line 35 is preferably patterned so that the ground electrode 31 comprises a ground path 31a protruding into the touch electrode 32. The ground path 31a is delineated by a first part 35a of the dividing line 35. The light emitting diode 6 is preferably arranged over the first part 35a of the dividing line 35, the first terminal 61 of the light emitting diode 6 being electrically connected to the ground path 31a. In this embodiment, the ground path 31a extends inside the touch area 32a. Thus, the light emitting diode 6 may be arranged over the touch area 32a, all along the ground path 31a. Therefore the illumination of the touch area 32a may be optimized by positioning the light emitting diode 6 in an adequate manner.

The ground path 31a has preferably a width W2 so that the sensitivity of the touch area 32a is not significantly reduced.

At the end of the ground path 31a, a ground area 31b may be arranged to facilitate the connection with the first terminal 61 of the light emitting diode 6. For this purpose, the ground area 32b has at least a dimension greater than the width W2 of the ground path 31a. This ground area 31b may have any suitable shape, such as a square, a rectangular or a circle.

In a preferred embodiment, the ground path 31a has a length less than or equal to the width W1 of the touch area 32a to avoid losing too much sensitive surface. The reduction of the touch area 32a is limited, thus its sensitivity remains nearly unchanged.

The touch area 32a has preferably a shape symmetrical with respect to a centre point. In this case, the light emitting diode 6 is preferably arranged over the centre point with the aim of optimizing the illumination of the touch area 32a.

Advantageously, the ground electrode 31 is also electrically insulated from the rest of the electrically conductive layer 2 by a second dividing line 36, preferably similar to the first dividing line 35. Thus, the electrically conductive layer 2 comprises a first portion in which the touch sensitive structure 30 is formed, and a second portion formed by the rest of the electrically conductive layer 2. The second portion of the electrically conductive layer 2 can be used for another application.

The lighting laminated glazing 100 comprises a lighting device 3' configured to illuminate the inside of the vehicle. The lighting device 3' is a functional element controlled by the touch sensitive device 3. When the switching signal is triggered due to the operation of the touch sensitive device 3, the lighting device 3' is turned on or turned off.

In this embodiment, the lighting device 3' comprises an electrically conductive structure 30' formed in the second portion of the electrically conductive layer 2, and a plurality of high-output light emitting diodes 6' arranged on the electrically conductive structure 30'. In another embodiment, the second portion of the electrically conductive layer 2 may be used as an athermic layer or a heating layer.

The electrically conductive structure 30' comprises a negative electrode 31' and a positive electrode 32'. Each high-output light emitting diode 6' has a first terminal 61' being an anode zone electrically connected to the negative electrode 31', and a second terminal 62' being a cathode zone electrically connected to the positive electrode 32'.

The high-output light emitting diodes 6' are more powerful than the indicator diode 6. Preferably, the high-output light emitting diodes 6' emit a white light which is, for example, a light especially suited for reading.

In this embodiment, the ground electrode 31 is surrounded by the positive electrode 32, the two of them being electrically insulated from one another by the second dividing line 36. Similarly, the positive electrode 32' is for example surrounded by the negative electrode 31', the two of them being electrically insulated from one another preferably by a third dividing line 35'. Advantageously, the high-output light emitting diodes 6' are arranged over the third dividing line 35'. Preferably, the arrangement of the high-output light emitting diodes 6' forms a circle centred at the light emitting diode 6.

Advantageously, the lighting device 3' comprises a second voltage source 37' which supplies power voltage to the high-output light emitting diodes 6' through the electrically conductive structure 30'. The second voltage source 37' has a negative terminal connected to the negative electrode 31' via a third electrically conductive element 41' and a positive terminal connected to the positive electrode 32' via a fourth electrically conductive element 42'. Thus, similarly to the light emitting diode 6, there is no need for independent electrically conductive connectors for the high-output light emitting diodes 6'.

The lighting device 3' is operated by the triggering of the touch sensitive device 3. For example, the switching signal generated by the touch sensitive device 3 turns on or off the second voltage source 37'.

Preferably, an opaque enamel 12 is disposed around the edges of the first transparent glazing 1, as shown in FIG. 1A. The lighting laminated glazing 100 is for example glued to the roof frame during installation in the vehicle body, thus the opaque enamel 12 enables to conceal the adhesive bead. Moreover, the various connections between the electrically conductive elements and the electrically conductive layer are also hidden by the opaque enamel 12.

Figure 1B:
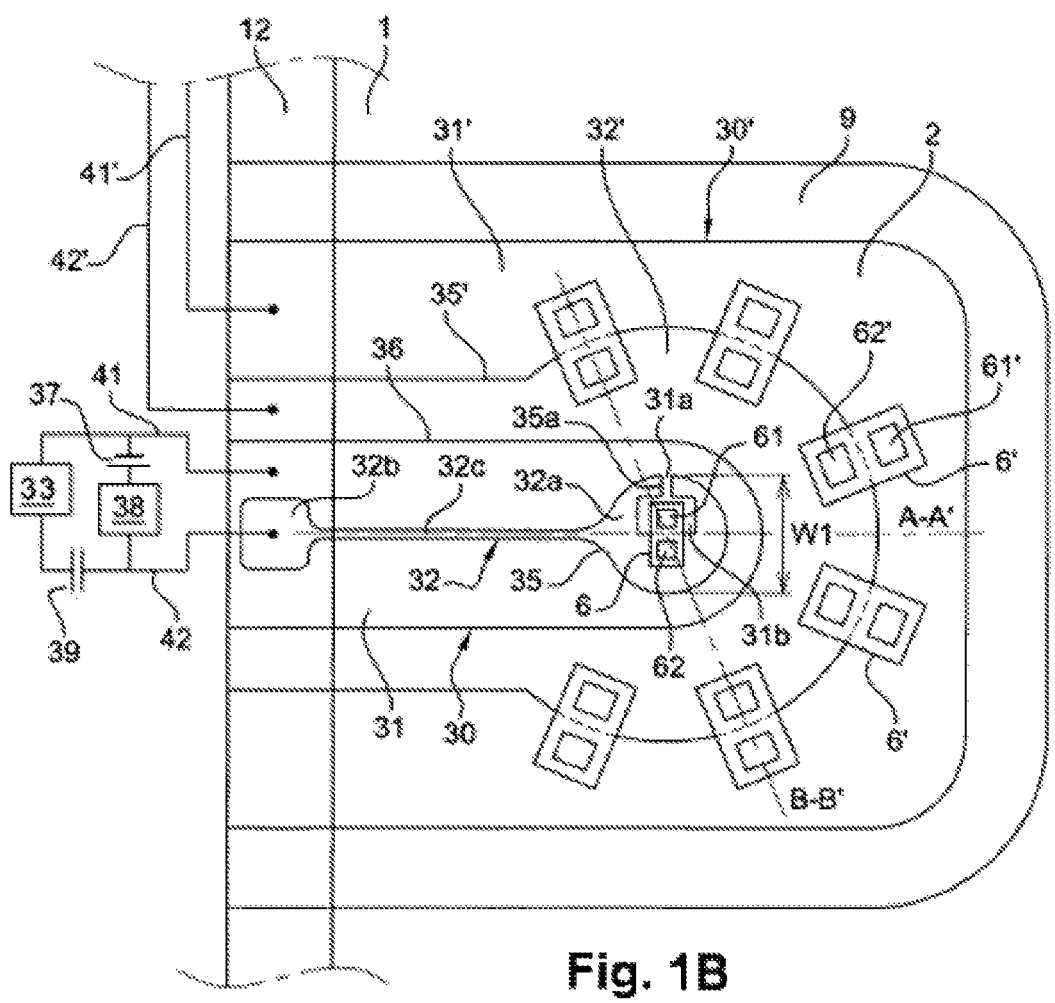
FIG. 1B is an enlarged view of the detail Z of FIG. 1A.
Figure 1C:
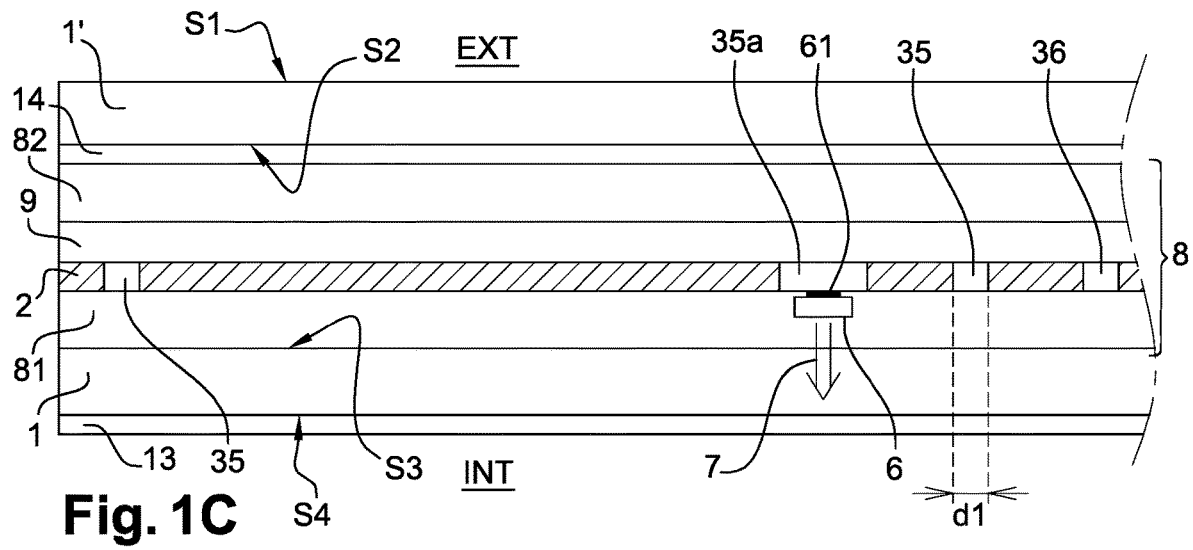
FIG. 1C is a cross-section view along the section line A-A' of FIG. 1B.

FIG. 1C is a cross-section view along the section line A-A' of FIG. 1B. The lighting laminated glazing 100 comprises a second glazing 1' preferably made of mineral glass. In this embodiment, although the lighting laminated glazing 100 is an automotive glazing roof, the second glazing 1' is not necessarily transparent.

The first transparent glazing 1 and the second glazing 1' each have a first main surface and a second main surface opposed to the first main surface. In this embodiment, the second main surface of the first transparent glazing 1, known in the field as surface S4, is intended to be oriented toward the inside INT of the vehicle. Similarly, the first main surface of the second glazing 1', known in the field as surface S1, is intended to be oriented toward the outside EXT of the vehicle. The first main surface of the first transparent glazing 1 and the second main surface of the second glazing 1' are inner-side surfaces of the lighting laminated glazing and are respectively known in the field as surface S3 and surface S2.

In this embodiment, the first transparent glazing 1 and the second glazing 1' are bonded together by an intermediate layer 8 made of thermoplastic material. Preferably, the intermediate layer 8 comprises a first layer 81 and a second layer 82 between which the carrier layer 9 is disposed. The intermediate layer 8 is for example made of polyvinyl butyral (PVB). The light emitting surface of the light emitting diode 6 is preferably facing the opposite direction of the touch sensitive area 32a. Thus, the carrier layer 9 is arranged in such a way that the light emitting surface is oriented towards the inside INT of the vehicle, as represented by the arrow 7, where the touch sensitive area 32a is intended to be touched.

In this embodiment, the touch sensitive device 3 is intended to be triggered from the inside of the vehicle. Thus, the carrier layer 9 is preferably disposed in such a way that the electrically conductive layer is closer to the first main surface S3 of the first transparent glazing 1 than the second main surface S2 of the second glazing 1'.

The carrier layer 9 preferably extends over only a portion of the surface of the first transparent glazing 1, as shown in FIG. 1A. In this case, the first intermediate layer 81 bounding the carrier layer 9 to the first transparent glazing 1 is not mandatory and may be replaced by local adhesive means. In another embodiment, the carrier layer 9 may extend over the entire surface of the lighting laminated glazing 100.

A low-E layer 13 is preferably applied on the second main surface S4 of the first transparent glazing 1.

A sun protection layer 14 is preferably applied on the second main surface S2 of the second glazing 1'. The sun protection layer 14 according to the invention is known, for example, from US 2014377580 A1.

Alternatively we may have any heating transparent conductive layer on side S3 that could form the conductive layer with the indicator light with a reverse mounting In this configuration, the touch sensitive device 3 is intended to be triggered from the inside INT of the vehicle. To prevent switching from the outside EXT of the vehicle, the sensitivity of the sensor electronics assembly 33 may be adapted. It is also possible to increase the thickness of the intermediate layer 8 and/or the thickness of the second glazing 1'.

Figure 1D:
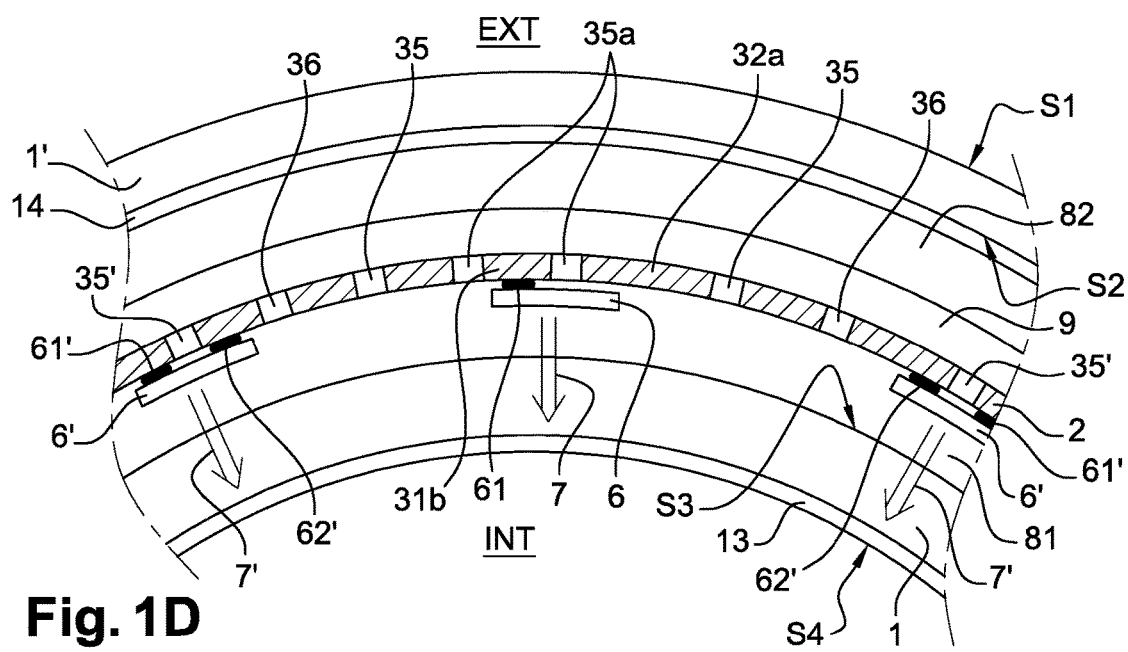
FIG. 1D is a cross-section view along the section line B-B' of FIG. 1B.

FIG. 1D is a cross-section view along the section line B-B' of FIG. 1B. The lighting device 3' being configured to illuminate the inside INT of the vehicle, each high-output light emitting diode 6' has advantageously a light emitting surface facing towards the inside INT of the vehicle, as represented by the arrow 7'.

Figure 2:
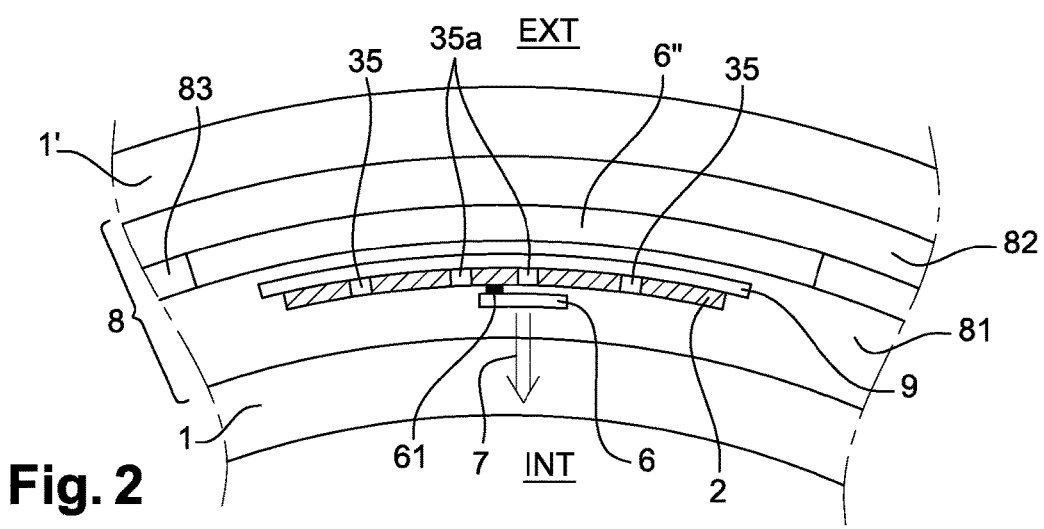
FIG. 2 is a cross-section view along the section line B-B' of an alternative embodiment of a lighting laminated glazing.

FIG. 2 is a cross-section view along the section line B-B' drawn on FIG. 1B of an alternative embodiment of a lighting laminated glazing 100. In this embodiment, instead of high-output light emitting diodes, the lighting device 3' comprises an illumination layer 6" including organic light emitting diodes. The illumination layer 6" is configured to illuminate the inside INT of the vehicle. In this case, seen from the inside INT of the vehicle, the carrier layer 9 is preferably disposed in front of the illumination layer 6", that is in a different plane from that of the illumination layer 6". Advantageously, the carrier layer 9 and the electrically conductive layer 2 are both transparent. Thus, the lighting provided by the illumination layer 6" is not hindered.

In another embodiment, the light emitting diode 6 is a multicolour light emitting diode. Thus, the state of the touch sensitive device 3, which also represents the state of the functional element associated with it, can be indicated. The multicolour light emitting diode 6 comprises several light emitting semiconductor chips, each one having a first terminal and a second terminal. In this case, the touch sensitive structure 30 comprises for example as many ground paths as the number of light emitting semiconductor chips. The ground paths are preferably electrically insulated from one another by dividing lines. Preferably, each first terminal is electrically connected to a different ground path. On the contrary, the second terminals are all electrically connected to the touch sensitive area 32a. Thus, the light emitting semiconductor chips can be operated separately. Preferably, the ground paths are electrically connected to the sensor electronics assembly 33 by electrically conductive elements.

For example, the multicolour light emitting diode 6 may comprise two light emitting semiconductor chips, thus two colours, preferably red and green. Then, when the functional element is turned on, the light emitting diode 6 emits a green light, and when the functional element is turned off, the light emitting diode 6 emits a red light.

Although the present invention has been described in relation to a lighting function, the touch sensitive device is suitable to control also a variety of other functional elements which may also be located in a vehicle roof, such as a suspended particle device or a variable diffusion device. Other automotive functional elements may be controlled, such as a heating function, windshield or rear wipers or air conditioning.

The touch sensitive structure may be disposed in any glazing of the vehicle. The present invention is also well suited for use in non-automotive glazing such as architectural glazing.

The sensor electronics assembly can face the first transparent glazing. The sensors electronics assembly can be inside or on the intermediate layer (PVB, EVA etc).

The sensors electronics assembly can comprise an AC (voltage) source configured to supply AC to the touch sensitive structure. Then the DC voltage source can be decoupled from the sensor electronics assembly notably by a capacitor.

The invention claimed is:

1. A lighting laminated glazing comprising:
a first transparent glazing;
a second glazing;
an intermediate layer made of thermoplastic material, laminating the second glazing to the first transparent glazing;
an electrically conductive layer disposed between the first transparent glazing and the second glazing, preferably transparent;
a capacitive touch sensitive device comprising a capacitive touch sensitive structure formed in said electrically conductive layer, the capacitive touch sensitive structure comprising a ground electrode and a touch electrode having a touch sensitive area wherein the touch electrode is surrounded by the ground electrode, the touch electrode and the ground electrode being electrically insulated from one another by a dividing line;
a light emitting indicator diode, arranged on the electrically conductive layer to indicate the touch sensitive area, the light emitting indicator diode having a light emitting surface facing at least partially the touch sensitive area, the light emitting indicator diode having a first terminal being a first electrode zone electrically connected to the ground electrode and a second terminal being a second electrode zone electrically connected to the touch sensitive area and said first electrode zone disposed within the touch sensitive area and the light emitting indicator diode being within the touch sensitive area;
a lighting device controlled by the capacitive touch sensitive device, the lighting device comprising a lighting element distinct from the light emitting indicator diode, the lighting element being disposed between the first transparent glazing and the second glazing.

2. The lighting laminated glazing according to claim 1, wherein the dividing line is patterned so that the ground electrode comprises a ground path protruding into the touch sensitive area, the ground path being delineated by a first part of the dividing line, the light emitting indicator diode being arranged over the first part of the dividing line, the first terminal of the light emitting indicator diode being electrically connected to the ground path.

3. The lighting laminated glazing according to claim 2, wherein the touch sensitive area has a width, the ground path having a length less than or equal to the width of the touch sensitive area.

4. The lighting laminated glazing according to claim 3, wherein the touch area has a shape symmetrical with respect to a centre point.

5. The lighting laminated glazing according to claim 1, configured to form a vehicle roof, the lighting device being configured to illuminate an inside of a vehicle, the first transparent glazing being an interior glazing, the second glazing being an exterior glazing.

6. The lighting laminated glazing according to claim 5, wherein the first transparent glazing has a first main surface and a second main surface opposed to the first main surface, the second main surface being intended to be oriented towards the inside of the vehicle, the electrically conductive layer being disposed closest to the first main surface of the first transparent glazing.

7. The lighting laminated glazing according to claim 1, wherein the capacitive touch sensitive structure is formed in a first portion of the electrically conductive layer, the lighting device comprising:
an electrically conductive structure, the electrically conductive structure comprising a negative electrode and a positive electrode;
a plurality of light emitting diodes, arranged on the electrically conductive structure, each light emitting diode having a first terminal being an anode zone electrically connected to the negative electrode and a second terminal being a cathode zone electrically connected to the positive electrode.

8. The lighting laminated glazing according to claim 7, wherein the positive electrode is surrounded by the negative electrode, the positive electrode and the negative electrode being electrically insulated from one another by a dividing line, each light emitting diode of the lighting device being arranged over the dividing line.

9. The lighting laminated glazing according to claim 8, wherein the touch electrode is surrounded by the ground electrode, the ground electrode being surrounded by the positive electrode, the positive electrode being surrounded by the negative electrode.

10. The lighting laminated glazing according to claim 1, wherein the light emitting indicator diode is a inorganic light emitting diode comprising a emitting semiconductor chip or a multicolour inorganic light emitting diode comprising a plurality of light emitting semiconductor chips, each of the light emitting semiconductor chips having said first and second terminals, the touch sensitive structure comprising a plurality of ground paths electrically insulated from one another by dividing lines, each said second terminal being electrically connected to one of the ground paths.

11. The lighting laminated glazing according to claim 1, wherein the light emitting indicator diode comprises an organic light emitting diode.

12. The lighting laminated glazing according to claim 1, wherein the electrically conductive layer is applied on a carrier, which is disposed between the first transparent glazing and the second glazing, said carrier notably is local or and extending over a surface of the first transparent glazing.

13. The lighting laminated glazing according to claim 12, wherein the carrier is a transparent polymer foil.

14. The lighting laminated glazing according to claim 1, wherein the electrically conductive layer is transparent and extends over the first transparent glazing, the electrically conductive layer being in contact with a first main surface of the first transparent glazing or in a transparent carrier.

15. The lighting laminated glazing according to claim 14, wherein the electrically conductive layer is a heating element, a solar control layer, or a low e layer.

16. The lighting laminated glazing according to claim 1, wherein the lighting device comprises a plurality of light emitting diodes, the light emitting diodes being disposed around the light emitting indicator diode or orthogonal projections of the light emitting diodes on the conductive layer being situated around the light emitting indicator diode.

17. The lighting laminated glazing according to claim 1, wherein the capacitive touch sensitive device comprises a sensor electronics assembly configured to control the touch sensitive structure, and a voltage source configured to supply power voltage to the light emitting indicator diode through the touch sensitive structure, the sensor electronics assembly and/or the voltage source being disposed outside the first transparent glazing.

18. The lighting laminated glazing according to claim 17, wherein the voltage source is decoupled from the sensor electronics assembly.

19. The lighting laminated glazing according to claim 17, wherein the voltage source is a DC voltage source.

20. The lighting laminated glazing according to claim 1, wherein the capacitive touch sensitive device comprises a controller configured to control an operation of the light emitting indicator diode and a voltage source.

21. A method for manufacturing the lighting laminated glazing according to claim 1, the lighting laminated glazing comprising:
 the first transparent glazing;
 the second glazing;
 the intermediate layer made of thermoplastic material laminating the first transparent glazing to the second glazing;
 the touch capacitive sensitive device comprising the capacitive touch sensitive structure;
 the lighting device controlled by the touch capacitive sensitive device, the lighting device comprising the lighting element;
the method comprising:
 disposing the electrically conductive layer between the first transparent glazing and the second glazing;
 forming the capacitive touch sensitive structure in the electrically conductive layer, the capacitive touch sensitive structure comprising the ground electrode and the touch electrode having the touch sensitive area;
 arranging the light emitting indicator diode on the electrically conductive layer to indicate the touch sensitive area, the light emitting indicator diode having the light emitting surface facing at least partially the touch sensitive area, the light emitting indicator diode, having the first terminal being the first electrode zone electrically connected to the ground electrode and the second terminal being the second electrode zone electrically connected to the touch sensitive area;
 disposing the lighting element between the first transparent glazing and the second glazing.

22. The lighting laminated glazing according to claim 1, wherein the first transparent glazing and the second glazing are made of mineral glass.

* * * * *